United States Patent
Yamaguchi et al.

(10) Patent No.: US 6,531,070 B1
(45) Date of Patent: Mar. 11, 2003

(54) PIEZOELECTRIC BODY

(75) Inventors: Hirofumi Yamaguchi, Komaki (JP); Takaaki Koizumi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/643,116

(22) Filed: Aug. 21, 2000

(30) Foreign Application Priority Data

Aug. 31, 1999 (JP) .......................................... 11-246288
Sep. 8, 1999 (JP) .......................................... 11-254617
Aug. 7, 2000 (JP) ........................................ 2000-238738

(51) Int. Cl.[7] ........................ C04B 35/47; C04B 35/475
(52) U.S. Cl. ................................ 252/62.9 R; 501/134
(58) Field of Search ..................... 252/62.9 R; 501/134

(56) References Cited

U.S. PATENT DOCUMENTS 5,637,542 A * 6/1997 Takenaka .................... 501/134
5,945,030 A * 8/1999 Kimura et al. ............... 501/134
6,004,474 A * 12/1999 Takenaka et al. ......... 252/62.9 R

FOREIGN PATENT DOCUMENTS

JP          10-324569         12/1998

* cited by examiner

Primary Examiner—C. Melissa Koslow
(74) Attorney, Agent, or Firm—Burr & Borwn

(57) ABSTRACT

A piezoelectric body is provided, including $(Bi_{1/2}Na_{1/2})TiO_3$ as a main component which is obtained by forming and sintering powders. A heterogeneous phase, other than $(Bi_{1/2}Na_{1/2})TiO_3$ system perovskite phase, in the powders has a peak ratio relative to the strongest peak of the perovskite phase of 5% or lower as determined by powder X-ray diffraction. As a result, the frequency of the dielectric breakdown in a sintered piezoelectric body during polarization can be dramatically reduced to 0.1 to 2% of that experienced in prior art compositions The manufacturing yield can be increased, manufacturing costs can be reduced, and the overall reliability of products manufactured therefrom can be improved.

2 Claims, 1 Drawing Sheet

PIEZOELECTRIC BODY

BACKGROUND OF THE INVENTION

The present invention relates to a piezoelectric body which is fired into a porcelain, more particularly, it relates to piezoelectric bodies used in actuators and sensors which are integrated as electromechanical transducers for positioning a precision machine tool, for controlling an optical path in an optical apparatus, as a valve for controlling a flow rate, as an ultrasound motor, or as a brake apparatus for an automobile.

Further, the present invention relates to a piezoelectric body which is suitably used in an element for measuring the properties of liquid and as an element for measuring a minute mass.

A piezoelectric body is a material that converts electrical energy into mechanical energy. A distortion is generated when an external electric field s applied thereto, and mechanical energy is converted into electrical energy, and an electrical charge is generated when a mechanical stress is applied.

One piezoelectric material used as an actuator, as a filter and as various sensors is a material containing $(Bi_{1/2}Na_{1/2})TiO_3$ as a main component and a three-component system of piezoelectric porcelain composition which consists of this material, $MeNbO_3$ (Me is K or Na) and $Bi_2O_3.Sc_2O_3$. This material is disclosed, for example, in JP-A 10-324569.

Although the above piezoelectric porcelain composition disclosed in JP-A 10-324569 is a three-component system material containing $(Bi_{1/2}Na_{1/2})TiO_3$ as a main component, $MeNbO_3$ (Me is K or Na) and $Bi_2O_3.Sc_2O_3$, the composition has a high polarization voltage and, thus, it has a high frequency (about 30%) of producing dielectric breakdown during polarization.

SUMMARY OF THE INVENTION

It is an object of the present invention to overcome the above-discussed drawbacks in the prior art. To that end, the present invention provides a piezoelectric body containing $(Bi_{1/2}Na_{1/2})TiO_3$ as a main component and having a reduced frequency of producing dielectric breakdown during polarization.

In accordance with one embodiment of the present invention, the piezoelectric body obtained by forming and sintering powders including $(Bi_{1/2}Na_{1/2})TiO_3$ perovskite phase as a main component, wherein a heterogeneous phase other than the $(Bi_{1/2}Na_{1/2})TiO_3$ system perovskite phase in the powders, has a peak ratio relative to the strongest peak of the perovskite phase of 5% or lower as determined by powder X-ray diffraction. In the sintered piezoelectric body, this dramatically reduces the frequency of producing dielectric breakdown to 0.1 to 2% when the material is polarized at 6 kV/mm, relative to the breakdown frequency in the prior art piezoelectric body.

In addition, since the piezoelectric body has a heterogeneous phase present in an extremely small amount relative to the main phase, the crystal phase in the fired body is formed into a single $(Bi_{1/2}Na_{1/2})TiO_3$ system perovskite phase. Accordingly, the piezoelectric body also has high dielectric breakdown strength.

The piezoelectric body is made using a process sequence of mixing and calcination of raw material powders, wet grinding the powders with a ball mill to form a slurry, and then forming and sintering the dried powders. Unground powders and aggregates containing a heterogeneous phase are removed by passing the ground slurry through a sieve before drying the slurry. Since the heterogeneous phase produced during the calcination step is more difficult to grind compared to the main perovskite phase, it easily remains as coarse particles even after the grinding treatment. Therefore, separation of the heterogeneous phase becomes possible by appropriately selecting the size of the aperture of a sieve depending upon grinding time.

In addition, grinding time is preferably as short as 2 to 4 hours in order not to cause micronization of heterogeneous phase particles and to inhibit aggregation of particles. It is desirable that the specific surface area of the powders is not greater than 8 $m^2/g$ and not smaller than 2 $m^2/g$.

For detecting a heterogeneous phase, the conventional X-ray powder diffraction method was used. With reference to FIG. 1, the peak intensity of peak 1, which is the strongest peak among the peaks of the $(Bi_{1/2}Na_{1/2})TiO_3$ perovskite phase is measured, as well as the peak intensity of peak 2, which is the strongest peak of the heterogeneous phase other than the perovskite phase. The peak intensity ratio of the peak intensity of peak 2 to that of peak 1 is then calculated.

In addition, $MeNbO_3$ (Me is Na or K), $Sc_2O_3.Bi_2O_3$, or the like, may be added to the $(Bi_{1/2}Na_{1/2})TiO_3$ as a form of substitution or solid solution. In addition, in the porcelain of the present invention, Zr, Si and the like may be irreversibly contained at an amount of 0.5 wt % or smaller.

The piezoelectric body of the present invention exhibits excellent displacement properties, which makes it useful as a general electromechanical transducing element. It is also suitably utilized as a well-densified thick film or thin film element, such as an actuator, a sensor, or the like.

For example, a diaphragm substrate having a thin diaphragm portion 3 to 50 μm in thickness, and preferably 5 to 15 μm, is prepared using sintered zirconia or alumina, preferably partially stabilized zirconia. An outwardly convex shape, curving in an opposite direction to a window part in a thin diaphragm which is integrally laminated so as to cover a window of a ceramic substrate described in JP-A 8-51238 is preferable. A diaphragm shape in which a flat part, or a curved part having a predetermined curvature, is formed on a convex top part or a part containing the same at a diaphragm part described in JP-A 8-130334 is also desirable.

A heat-resistant metal film of Pt, Pt-Pd alloy or the like having a thickness of 1 to 10 μm is formed on the surface of a thin part of this substrate as a lower electrode. A piezoelectric body relating to the present invention is formed on this lower electrode by a thick film method and fired at a temperature of 1000 to 1250° C. As a thick film method, dipping, screen printing, spin coating, or the like can be used. Preferably, screen printing is used. The thickness of the piezoelectric body after firing is preferably 1 to 40 μm and, more preferably, 5 to 25 μm. Pt, Au, Ag, Cu and the like, preferably, Au or Ag, is formed on the formed piezoelectric film as an upper electrode, so that the thickness is 2 μm or smaller.

The piezoelectric body thus formed is suitably utilized in a fine sensor or an actuator in an element for measuring the properties of liquid, or in an element for measuring a minute mass as disclosed in JP-A 8-201265.

DETAILED DESCRIPTION OF THE INVENTION

Figure 1:
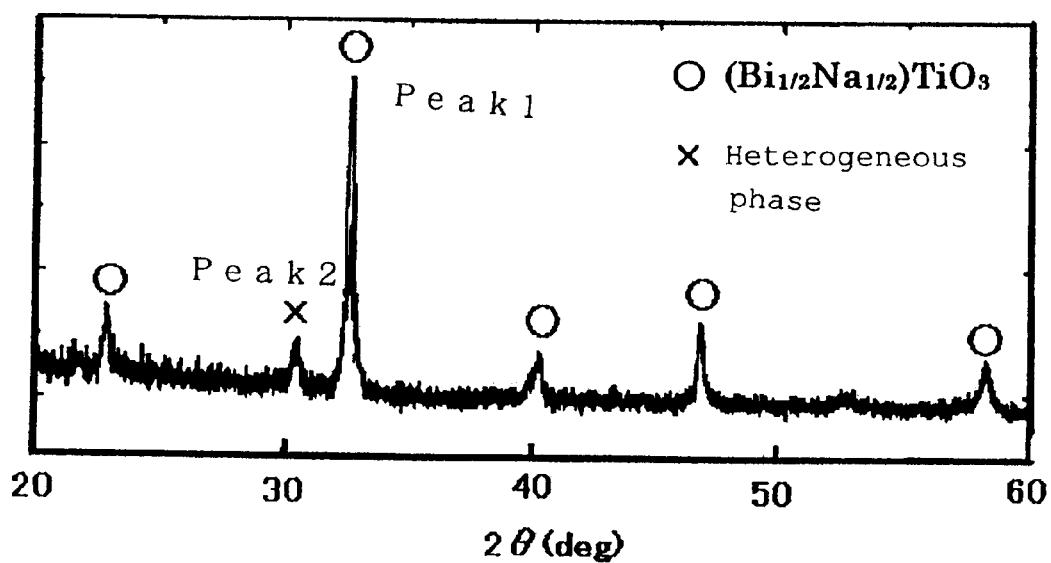
FIG. 1 is an X-ray powder diffraction pattern of the powder composition of the present invention.

The present invention will now be explained by way of the following examples.

EXAMPLE 1

Firsts bismuth oxide ($Bi_2O_3$), sodium hydrogen tartrate ($NaHC_4H_4O_6$) and titanium oxide ($TiO_2$) as raw materials were dried, weighed at an appropriate component ratio to yield $(Bi_{1/2}Na_{1/2})TiO_3$ in a final fired body, and wet-mixed with an ethanol solvent for 16 hours using 2 mm zirconia balls. The mixture was dried, calcined at 900° C. for 2 hours in the atmosphere, and wet ground in a ball mill for 2 hours. Powders in the slurry state after grinding were passed through 420 mesh nylon sieve to remove unground and aggregated materials and then dried. The crystal phase of the dried powders was examined by X-ray diffraction.

Then, a 20 φ×10 τ molded pellet was formed by pressing the dried powders, and the pellet was fired at 1150° C. for 2 hours in the atmosphere. The porcelain body obtained by firing was machined into a dimension of length 12 mm, width 3 mm and thickness 1 mm and a polarization electrical field of 6 kV/mm was applied for 10 minutes in the thickness direction in silicone oil. The frequency of dielectric breakdown during the polarization treatment was recorded.

EXAMPLE 2

Example 2 is a sample made under the same conditions as Example 1, except that the grinding step after the calcination treatment was performed for 4 hours.

EXAMPLE 3

Example 3 is a sample made under the same conditions as Example 1, except that the calcination temperature was 850° C.

COMPARATIVE EXAMPLE 1

The same conditions as those of the aforementioned Example 1 were used, except that grinding was performed with a ball mill for 10 hours instead of 2 hours after calcination.

COMPARATIVE EXAMPLE 2

The same conditions as those of the aforementioned Example 1 were used, except that the slurry powders after grinding were dried without passing through a 420 mesh sieve.

The results recording the frequency of the dielectric breakdown when these samples were polarized, as well as the results of X-ray diffraction of the powders, are shown in Table 1.

TABLE 1

| | Ratio of heterogeneous phase in powders (%) | Ratio of dielectric breakdown (%) |
|---|---|---|
| Example 1 | 1 | 0.1 |
| Example 2 | 3 | 0.5 |
| Example 3 | 5 | 2 |
| Comparative Example 1 | 7 | 30 |
| Comparative Example 2 | 10 | 50 |

These results show that dielectric breakdown during polarization can be reduced to 0.1 to 2% if the amount of heterogeneous phase is maintained at 5% or less.

Since the frequency of producing dielectric breakdown during polarization of a sintered piezoelectric body obtained by forming and sintering powders in which a peak intensity ratio (by powder X-ray diffraction) of a heterogeneous phase other than a $(Bi_{1/2}Na_{1/2})TiO_3$ perovskite phase in the powders is 5% or smaller relative to the strongest peak of the $(Bi_{1/2}Na_{1/2})$ system perovskite phase as a main component can be dramatically reduced to 0.1 to 2%, that is, several tenths to several hundredths of the breakdown frequency in the prior art piezoelectric body, manufacturing yield is increased and manufacturing costs can be reduced. Additionally, the reliability of the product, such as an actuator, a sensor or the like, can be improved.

In addition, since the piezoelectric body of the present invention has low reactivity with other materials when fired in the presence of other materials, such as placing the piezoelectric body on other materials, it does not reduce the inherent property of a piezoelectric body. Further, the present piezoelectric body has low influence on other materials, that is, it does not damage (e.g., crack) other materials. Therefore, a remarkable improvement in overall reliability in the final product is attained, together with a dramatic decrease in dielectric breakdown frequency.

What is claimed is:

1. A piezoelectric body comprising $(Bi_{1/2}Na_{1/2})TiO_3$ obtained by forming and sintering powders, and containing a heterogeneous phase other than a $(Bi_{1/2}Na_{1/2})TiO_3$ system perovskite phase in said powders, wherein the ratio of a peak, of said heterogeneous phase to the strongest peak of said perovskite phase is 5% or lower as determined by powder X-ray diffraction.

2. A piezoelectric body comprising $(Bi_{1/2}Na_{1/2})TiO_3$ obtained by forming and sintering powders, said powders containing a heterogeneous phase other than a $(Bi_{1/2}Na_{1/2}TiO_3$ system perovskite phase, wherein the ratio of a peak of said heterogeneous phase to the strongest peak of said perovskite phase in said powders is 5% or lower as determined by powder X-ray diffraction.

* * * * *